(12) United States Patent
Lin et al.

(10) Patent No.: US 9,412,689 B2
(45) Date of Patent: Aug. 9, 2016

(54) SEMICONDUCTOR PACKAGING STRUCTURE AND METHOD

(75) Inventors: Chun-Cheng Lin, New Taipei (TW); Chung-Shi Liu, Hsin-Chu (TW); Kuei-Wei Huang, Hsin-Chu (TW); Cheng-Ting Chen, Taichung (TW); Wei-Hung Lin, Xinfeng Township (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/357,379

(22) Filed: Jan. 24, 2012

(65) Prior Publication Data

US 2013/0187268 A1     Jul. 25, 2013

(51) Int. Cl.
| | |
|---|---|
| *H01L 23/02* | (2006.01) |
| *H01L 23/498* | (2006.01) |
| *H01L 25/10* | (2006.01) |
| *H01L 23/00* | (2006.01) |

(52) U.S. Cl.
CPC .... *H01L 23/49827* (2013.01); *H01L 23/49866* (2013.01); *H01L 25/105* (2013.01); *H01L 24/13* (2013.01); *H01L 24/16* (2013.01); *H01L 2224/131* (2013.01); *H01L 2224/13147* (2013.01); *H01L 2224/16225* (2013.01); *H01L 2224/16227* (2013.01); *H01L 2225/1023* (2013.01); *H01L 2225/1058* (2013.01); *H01L 2924/0132* (2013.01); *H01L 2924/0133* (2013.01); *H01L 2924/12042* (2013.01); *H01L 2924/15311* (2013.01); *H01L 2924/15321* (2013.01); *H01L 2924/18161* (2013.01)
USPC .......................................................... 257/686

(58) Field of Classification Search
CPC ................... H01L 23/49827; H01L 23/49866; H01L 24/16; H01L 24/13; H01L 25/105
USPC ......... 257/737–738, 686, 778, 779, 774, 758, 257/750, 692, 676
See application file for complete search history.

(56) References Cited

U.S. PATENT DOCUMENTS

| | | |
|---|---|---|
| 3,004,074 A1 | 8/2011 | Mori et al. |
| 8,133,762 B2 * | 3/2012 | Pagaila et al. .................. 438/117 |
| 2010/0327419 A1* | 12/2010 | Muthukumar ...... H01L 23/3121 257/686 |
| 2012/0012990 A1 | 1/2012 | Pagaila et al. |

FOREIGN PATENT DOCUMENTS

CN        101286484 A     10/2008

* cited by examiner

*Primary Examiner* — Hoa B Trinh
(74) *Attorney, Agent, or Firm* — Slater Matsil, LLP

(57) ABSTRACT

A system and method for packaging semiconductor dies is provided. An embodiment comprises a first package with a first contact and a second contact. A post-contact material is formed on the first contact in order to adjust the height of a joint between the contact pad a conductive bump. In another embodiment a conductive pillar is utilized to control the height of the joint between the contact pad and external connections.

20 Claims, 9 Drawing Sheets

SEMICONDUCTOR PACKAGING STRUCTURE AND METHOD

BACKGROUND

Generally, in a Package on Package (PoP) system individual semiconductor dies may be packaged either separately (or with multiple semiconductor dies in each separate package), and then the separate packages may be brought together and interconnected so that the individual semiconductor dies in the separate packages may be integrated together in order to perform a desired tasks. The individual packages may be electrically interconnected to each other, for example, by using contact bumps.

Such contact bumps may be formed by initially forming a layer of the contact material onto a substrate of the package. Once the layer of the contact material has been formed, the layer of contact material may be reflowed, by which the temperature of the contact material is increased in order to at least partially liquefy the contact material. This partial liquefaction allows the contact material to pull itself into a ball shape using its own surface tension.

Once formed, the contact bumps of one package may be placed into contact with contact pads from another package. Alternatively, the contact bumps may be placed into contact with other types or forms of contacts formed on the other package. Once the contact bumps have been aligned with their appropriate locations, the contact bumps may again be reflowed and reheated in order to again partially liquefy them and cause them to partially flow and form a bridge between the two packages. Once the contact bumps cool down and resolidify, the contact bumps are fully joined to each other. This joint between the contact bumps allows for both a physical connection between the contact bumps as well as an electrical connection that allows signals and power to cross from one package to another, thereby allowing the two packages to be integrated with each other and work together.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described with respect to embodiments in a specific context, namely a contact structure for a package-on-package (PoP) architecture. The embodiments may also be applied, however, to other packaging architectures and other contact structures.

Figure 1:
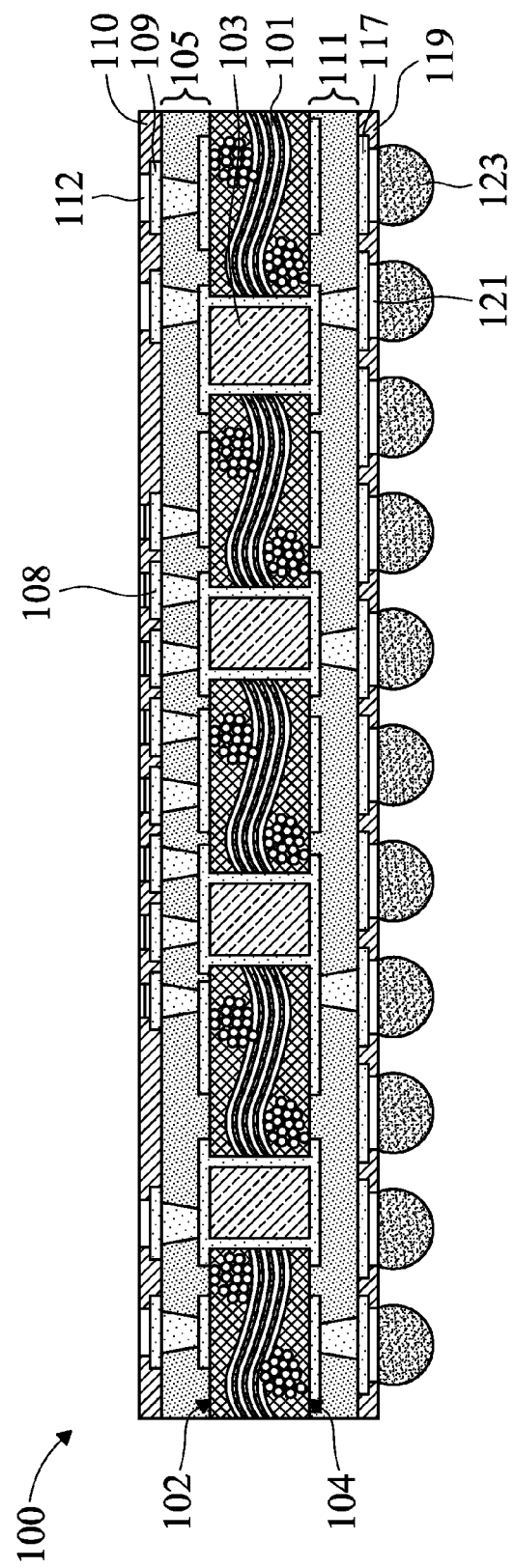
FIG. 1 illustrates a first package with first contacts and second contacts in accordance with an embodiment.

With reference now to FIG. 1, there is shown a first package 100 with a substrate 101, through substrate vias 103 extending from a first side 102 of the substrate 101 to a second side 104 of the substrate 101. A first redistribution layer 105, first contact pads 109, second contact pads 108, a first passivation layer 110, and first UBMs 112 may be located on the first side 102 of the substrate 101. A second redistribution layer 111, third contacts 117, second UBMs 121, and a second passivation layer 119 may be located on the second side 104 of the substrate 101.

The substrate 101 for the first package 100 may be, e.g., a silicon substrate, doped or undoped, or an active layer of a silicon-on-insulator (SOI) substrate, used to provide support for the first package 100. However, the substrate 101 may alternatively be a ceramic substrate, a polymer substrate, an interposer, or any other substrate that may provide a suitable protection and/or fan-out structure that may be desired. These and any other suitable materials may alternatively be used for the substrate 101.

The through substrate vias 103 may extend from the first side 102 of the substrate 101 to the second side 104 of the substrate 101, and may be formed by any appropriate method. For example, in an embodiment openings are formed partially through the substrate 101. The openings may be formed, for example, by one or more etching processes, milling, laser techniques, or the like. The openings are lined with diffusion barrier layers, adhesion layers, isolation layer, or the like, and filled with a conductive material. Preferably, diffusion barrier layers (not shown), comprise one or more layers of TaN, Ta, TiN, Ti, CoW, or the like, and the conductive material comprises copper, tungsten, aluminum, silver, and combinations thereof, or the like, thereby forming the through substrate vias 103. In an embodiment, the through substrate vias 103 have a diffusion barrier layer of TaN and are filled with copper formed by an electro-chemical plating process in which a seed layer is deposited to aid in the formation of the conductive fill material.

In another embodiment, the through substrate vias 103 may be formed and filled with a dielectric material. After grinding the backside of the substrate 101, the dielectric material may then be removed via an etching process. Once removed, the dielectric material may be replaced with a conductive material, such as copper. Other methods and materials may be used.

The first redistribution layer 105 may be formed on the first side 102 of the substrate 101 and in electrical connection with the through substrate vias 103. The first redistribution layer 105 may extend away from the through substrate vias 103 and allow for the placement of the first contact pads 109 (discussed further below) anywhere desired. The first redistribution layer 105 may also be used to enlarge the pitch of the through substrate vias 103 in a fan-out pattern or else reduce the pitch of the through substrate vias 103.

The first redistribution layer 105 may be formed using common methods for forming interconnect lines in integrated circuits. Preferably, the first redistribution layer 105 comprises at least one conductive layer formed of a metal such as aluminum, copper, tungsten, titanium, and combinations thereof. The at least one conductive layer may be formed by plating the metal on a seed layer and then etching the undesired portions, leaving the at least one conductive layer, which may have a thickness of between about 2 μm and about 30 μm, with a preferred width of about 5 μm. Once the at least one conductive layer has been formed, a dielectric material may be formed over the at least one conductive layer, and vias may be formed through the dielectric material to provide electrical access to the at least one conductive layer. However, other materials and process, such as a well-known damascene process, could alternatively be used to form the first redistribution layer 105.

As one of skill in the art will recognize, the first redistribution layer 105 could be a single layer of conductive material or else could alternatively be multiple layers of conductive material, depending upon the properties desired. For example, the first redistribution layer 105 as formed above may be plated with another conductive material such as gold or chromium to provide good adhesion for a subsequently formed connector (described below). This plating could be done through a process such as CVD.

The first contact pads 109 and the second contact pads 108 may be formed in order to provide external contacts for the first redistribution layer 105. In an embodiment the second contact pads 108 may be used to provide external contacts from the first package 100 to a second package 400 (not illustrated in FIG. 1 but illustrated and discussed below with respect to FIG. 4). Additionally, the first contact pads 109 may be used to provide external contacts to a third package 500 (also not illustrated in FIG. 1 but illustrated and discussed below with respect to FIG. 5).

The first contact pads 109 and the second contact pads 108 and may be formed of a conductive material such as aluminum, although other suitable materials, such as copper, tungsten, or the like, may alternatively be utilized. The first contact pads 109 and the second contact pads 108 may be formed using a process such as CVD, although other suitable materials and methods may alternatively be utilized. Once the material for the first contact pads 109 and the second contact pads 108 has been deposited, the material may be shaped into the first contact pads 109 using, e.g., a photolithographic masking and etching process.

After the first contact pads 109 and the second contact pads 108 have been formed, a first passivation layer 110 may be formed to help isolate and protect the first contact pads 109 and the second contact pads 108. In an embodiment the first passivation layer 110 may be formed from a polymer such as polyimide, or may alternatively be formed of materials such as silicon oxides, silicon nitrides, low-k dielectrics, extremely low-k dielectrics, combinations of these, and the like. The first passivation layer 110 may be formed to have a thickness of between about 2 μm and about 15 μm, such as about 5 μm.

Once the first passivation layer 110 has been formed, the first UBMs 112 may be formed in contact with the first contact pads 109 and the second contact pads 108. In an embodiment the first UBMs 112 may be formed by initially forming an opening for the first UBMs 112 through the first passivation layer 110 using, e.g., a photolithographic masking and etching process. Once at least a portion of the first contact pads 109 and the second contact pads 108 have been exposed, the first UBMs 112 may be formed in electrical contact with the first contact pads 109 and the second contact pads 108. The first UBMs 112 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the first UBMs 112. Any suitable materials or layers of material that may be used for the first UBMs 112 are fully intended to be included within the scope of the embodiments.

The first UBMs 112 may be created by forming each layer over the first contact pads 109 and the second contact pads 108. The forming of each layer may be performed using a plating process, such as electrochemical plating, although other processes of formation, such as sputtering, evaporation, or PECVD process, may alternatively be used depending upon the desired materials. The first UBMs 112 may be formed to have a thickness of between about 0.7 μm and about 10 μm, such as about 5 μm. Once the desired layers have been formed, portions of the layers may then be removed through a suitable photolithographic masking and etching process to remove the undesired material and to leave the first UBMs 112 in a desired shape, such as a circular, octagonal, square, or rectangular shape, although any desired shape may alternatively be formed.

On the second side 104 of the substrate 101, the second redistribution layer 111, the third contacts 117, the second passivation layer 119, and the second UBMs 121 may be formed in order to provide for a connectivity from the through substrate vias 103 to external devices (not shown in FIG. 1). In an embodiment, the second redistribution layer 111, the third contacts 117, the second passivation layer 119, and the second UBMs 121 may be formed in similar fashions and from similar materials as the first redistribution layer 105, the first contact pads 109, and the first passivation layer 110, and the first UBMs 112, respectively, described above. However, the second redistribution layer 111, the third contacts 117, the second passivation layer 119, and the second UBMs 121 may alternatively be formed using different methods and materials.

Once the second UBMs 121 have been formed on the second side 104 of the substrate 101, first conductive connectors 123 may be formed over the second UBMs 121. The first conductive connectors 123 may be, e.g., contact bumps and may comprise a material such as tin, or other suitable materials, such as silver, lead-free tin, or copper. In an embodiment in which the first conductive connectors 123 are tin solder bumps, the first conductive connectors 123 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape.

However, the described embodiments are not intended to be limited to a contact bump as described above. Any other suitable contact connection, such as a copper connection, a conductive pillar (such as a copper pillar), or any other type of connection may alternatively be utilized. All suitable connections are fully intended to be included within the scope of the embodiments.

Figure 2:
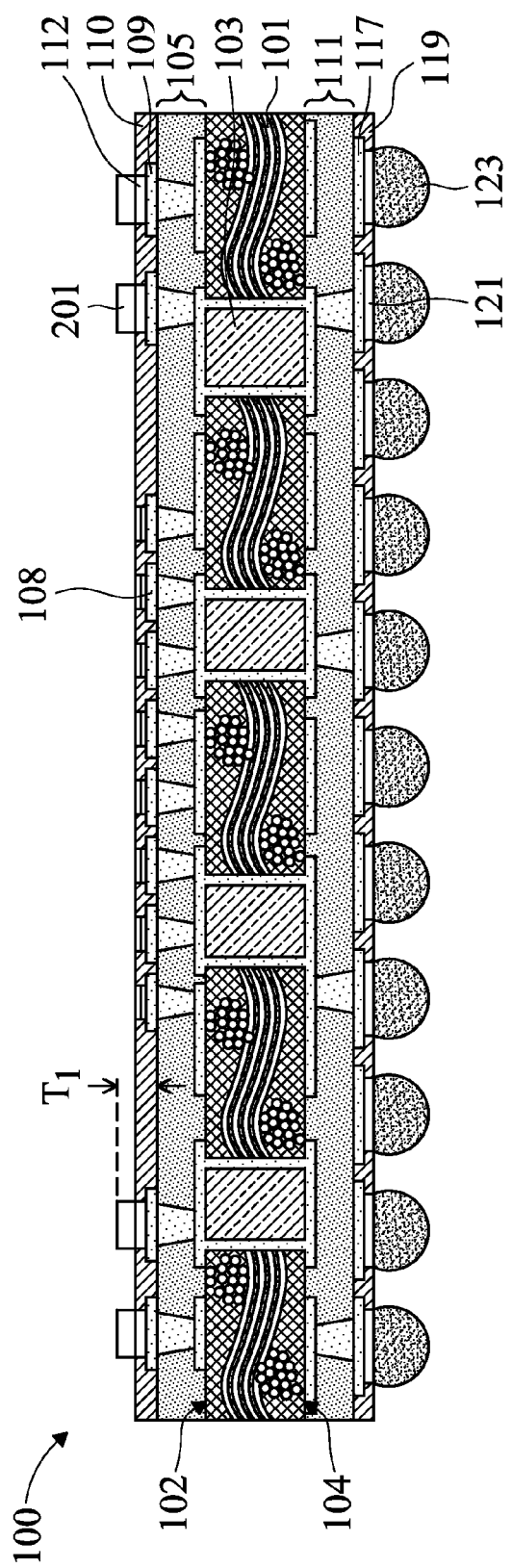
FIG. 2 illustrates the formation of post-contact material onto the first contact in accordance with an embodiment.

FIG. 2 illustrates the formation of a post-contact material 201 on the first UBMs 112. In an embodiment the post-contact material 201 may be used to adjust the height of the joint between the first UBMs 112 and the second conductive connectors 301 (not illustrated in FIG. 2 but illustrated and described below with respect to FIG. 3). In an embodiment in which the second conductive connectors 301 are solder balls, the post-contact material 201 may be, e.g., a high melting point pre-solder such as SnCu, SnAg, SnAgCu, or SnAu, combinations of these, or the like. The post-contact material 201 may be printed onto the first UBMs 112, although other processes, such as electroplating or electroless plating, may alternatively be utilized.

In an embodiment, the post-contact material 201 may be formed to have a first thickness $T_1$ that is large enough to reduce or eliminate the possibility of a cold joint between the first UBMs 112 and the second conductive connectors 301. In an embodiment, the first thickness $T_1$ may be between about 10 μm and about 200 μm, such as about 100 μm. However, while these thicknesses are illustrative, the first thickness $T_1$ is not intended to be limited to these thicknesses, as any suitable thickness may alternatively be utilized as needed to prevent a cold joint from occurring.

Figure 3:
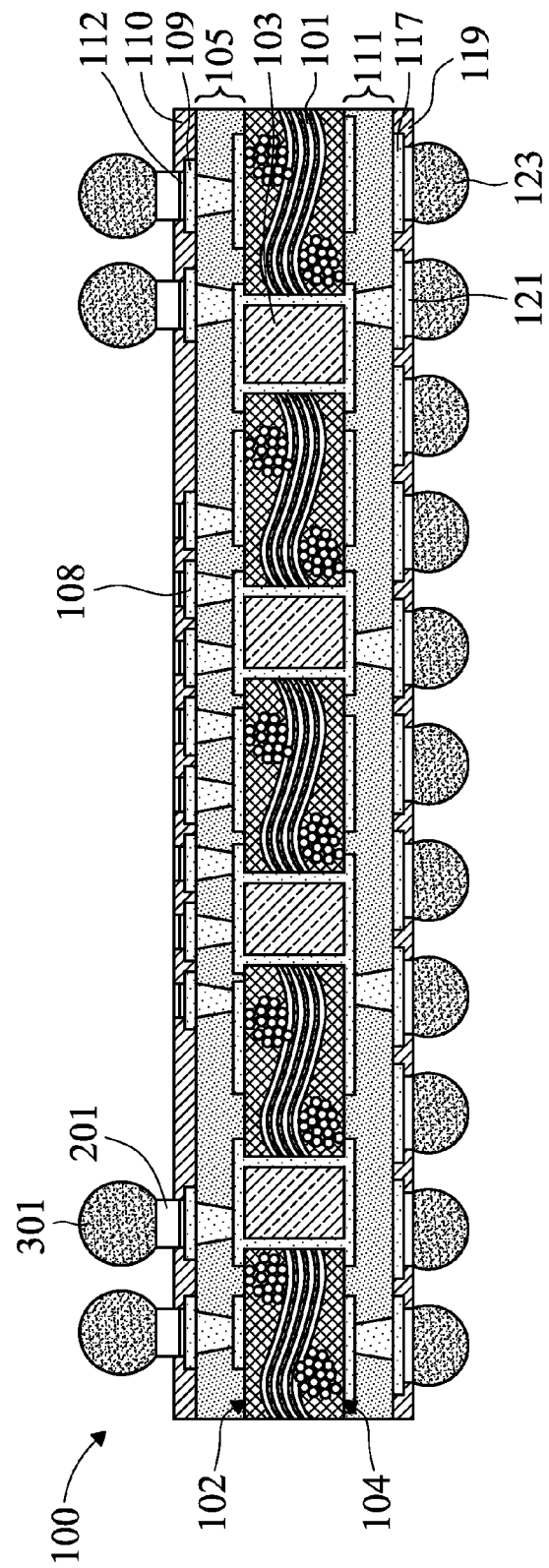
FIG. 3 illustrates the formation of contacts onto the post-contact material in accordance with an embodiment.

FIG. 3 illustrates that, after the post-contact material 201 has been formed, second conductive connectors 301 may be formed on the post-contact material 201. In an embodiment the second conductive connectors 301 may be similar to the first conductive connectors 123, and may be, e.g., conductive bumps such as solder bumps, and may comprise a material such as tin, or other suitable materials, such as silver, lead-free tin, or copper. Alternatively, the second conductive connectors 301 may be a material such as SnZn, SnBi, SnIn, SnCd, combinations of these, or the like, and which may have a melting point that is lower than the post-contact material 201. In an embodiment in which the second conductive connectors 301 are tin solder bumps, the second conductive connectors 301 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape.

Figure 4:
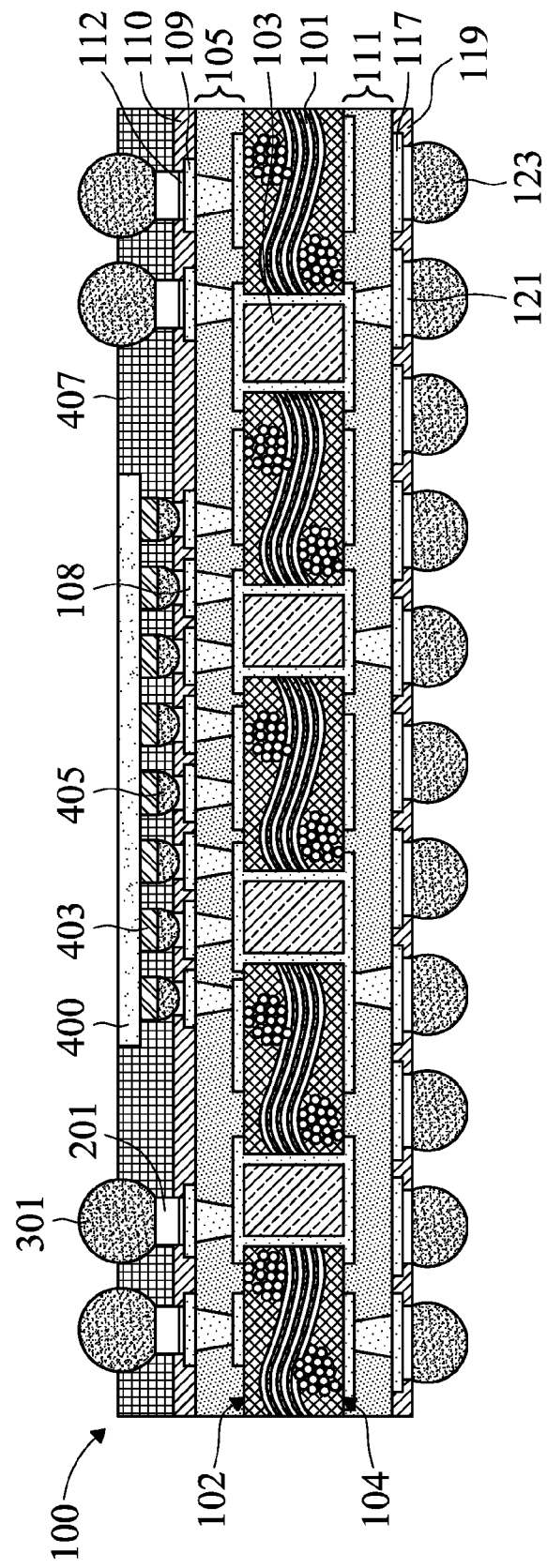
FIG. 4 illustrates the bonding of a second package onto the first package in accordance with an embodiment.

FIG. 4 illustrates a bonding and encapsulation of a second package with the first package 100. In an embodiment the second package 400 may be a package for a semiconductor die (not individually illustrated in FIG. 4) upon which various active and passive devices (such as transistor, resistors, capacitors, inductors, and the like) have been formed in order to create a functional device. The semiconductor die may also comprise an alternating series of conductive and dielectric layers over the active and passive devices in order to interconnect and isolate the various devices and to form functional circuitry.

Additionally, in order to connect the functional circuitry to the first package 100, the first die may be packaged within the second package 400, and the second package 400 may have fourth contacts 403 to connect the second package 400 with the second contact pads 108 on the first package 100. The fourth contacts 403 may be a conductive material, such as copper, and may be, e.g., in the shape of a conductive pillar. The fourth contacts 403 may be formed utilizing, e.g., a photolithographic and plating process, forming the fourth contacts 403 in electrical contact with the underlying conductive layers of the second package 400 and the active and passive devices of the semiconductor die within the second package 400 in order to provide the external contact for these active and passive devices. However, the fourth contacts 403 are not intended to be limited to copper pillars, as any suitable type of contact, such as aluminum contact pads, solder bumps, wire bond pads, or the like, may alternatively be utilized.

The fourth contacts 403 (located on the second package 400) may be connected to the second contact pads 108 (located on the first package 100) using, e.g., a bonding process. In an embodiment the bonding process may comprise forming or otherwise placing a first connecting material 405, such as solder, on the fourth contacts 403, the second contact pads 108, or both. The fourth contacts 403 and the second contact pads 108 may then be placed in contact with each other (with the first connecting material 405 between them) and the first connecting material 405 may be reflowed in order to bond the second contact pads 108 to the fourth contacts 403 and also to bond the second package 400 to the first package 100.

Once the second package 400 has been bonded to the first package 100, the structure may be encapsulated using an encapsulant 407, such as molding compound, polyimide, PPS, PEEK, PES, a heat resistant crystal resin, combinations of these, or the like. In an embodiment the bonded first package 100 and second package 400 may be placed in a molding chamber (not illustrated), and the encapsulant 407 may be injected or otherwise placed into the molding chamber. The molding chamber shapes the encapsulant 407 into the desired shape in order to encapsulate the second package 400 on the first package 100 in order to provide support and protection to the second package 400. Once in place, the encapsulant 407 may be cured in order to harden the encapsulant 407 for optimum protection. While the exact curing process is dependent at least in part on the particular material chosen for the encapsulant 407, in an embodiment in which molding compound is chosen as the encapsulant 407, the curing could occur through a process such as heating the encapsulant 407 to between about 100° C. and about 130° C., such as about 125° C. for about 60 sec to about 3000 sec, such as about 600 sec. Additionally, initiators and/or catalysts may be included within the encapsulant 407 to better control the curing process.

Figure 5:
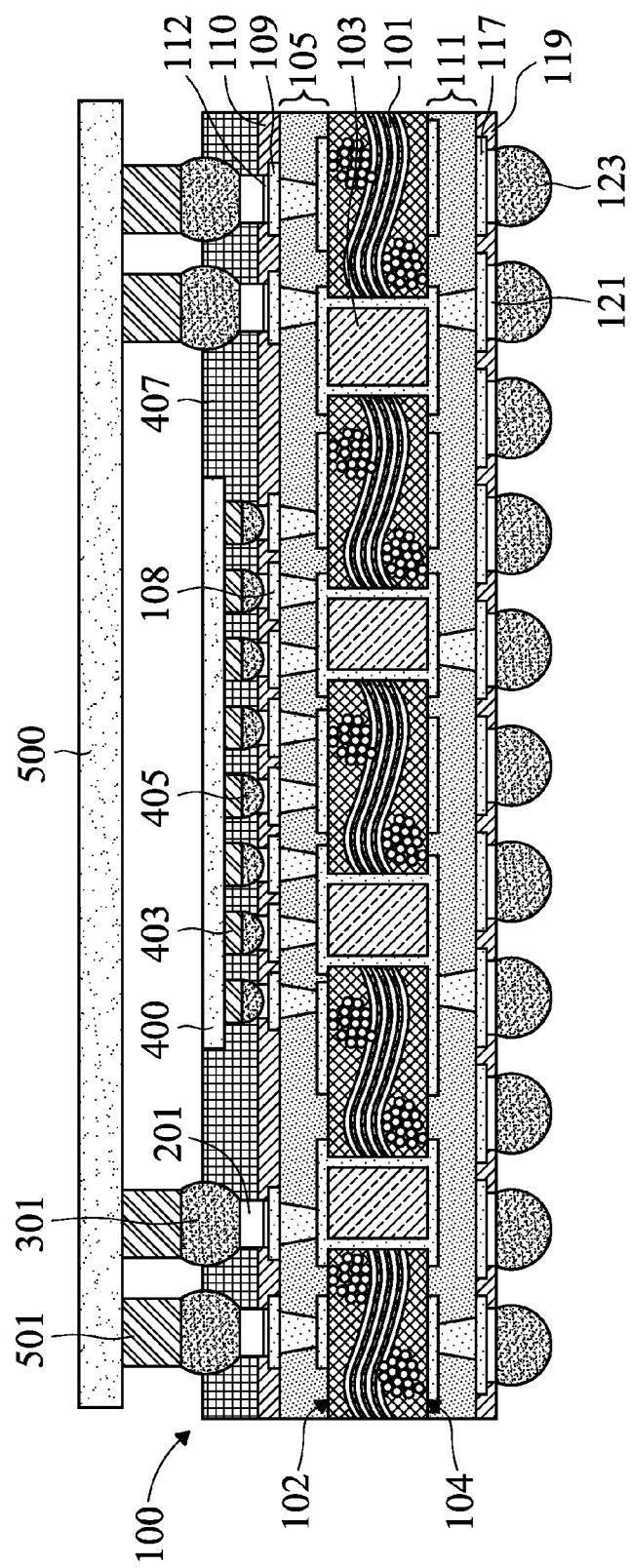
FIG. 5 illustrates a bonding of a third package onto the first package in accordance with an embodiment.

FIG. 5 illustrates the placement and bonding of a third package 500 onto the first package 100. In an embodiment the third package 500 may, similar to the second package 400, be a package for a semiconductor die upon which various active and passive devices (not individually illustrated in FIG. 5) may be formed. The third package 500 may similarly have fifth contacts 501 that may be electrically connected to the active and passive devices within the semiconductor die within the third package 500. The fifth contacts 501 may be formed from similar processes and materials as the fourth contacts 403 (described above with respect to FIG. 4), although the fifth contacts 501 may alternatively be made from different materials and different processes.

The third package 500 may be bonded to the first package 100 similar to the bonding process described above with respect to FIG. 4. For example, the bonding process may comprise placing the fifth contacts 501 and the first contact pads 109 in contact with each other (with the second conductive connectors 301 between them) and the second conductive connectors 301 may be reflowed in order to bond the first contact pads 109 to the fifth contacts 501 and also to bond the third package 500 to the first package 100.

Figure 6:
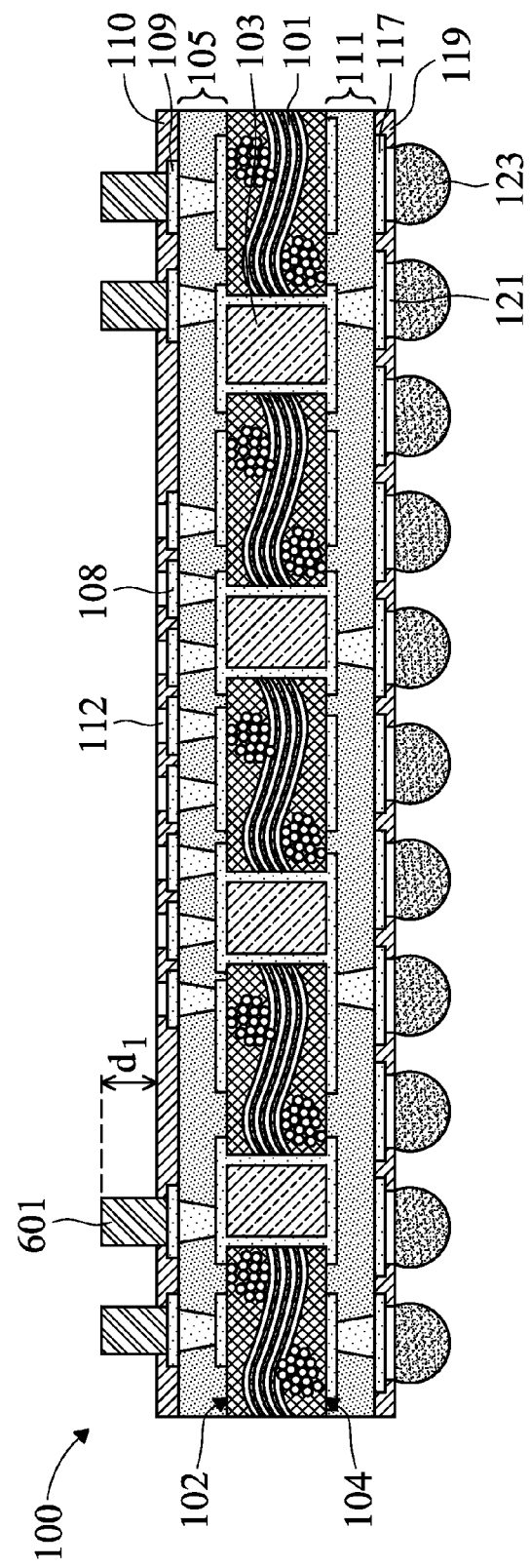
FIG. 6 illustrates a forming of conductive pillars on the contact pads in accordance with an embodiment.

FIG. 6 illustrates another embodiment in which conductive pillars 601 are utilized to control the joint height instead of the post-contact material 201. In this embodiment the conductive pillars 601 may be formed by initially forming a photoresist (not shown) over the first passivation layer 110 to a thickness greater than about 20 μm, or even greater than about 60 μm.

The photoresist may be patterned to expose portions of the first passivation layer 110 through which the conductive pillars 601 will extend. Once patterned, the photoresist may then be used as a mask to remove the desired portions of the first passivation layer 110, thereby exposing those portions of the first contact pads 109 to which the conductive pillars 601 will make contact.

After the first passivation layer 110 has been patterned, the conductive pillars 601 may be formed within the openings of both the first passivation layer 110 as well as the photoresist. The conductive pillars 601 may be formed from a conductive material such as copper, although other conductive materials such as nickel, gold, or metal alloy, combinations of these, or the like may also be used. Additionally, the conductive pillars 601 may be formed using a process such as electroplating, by which an electric current is run through the conductive portions of the first contact pads 109 to which the conductive pillars 601 are desired to be formed, and the first contact pads 109 are immersed in a solution. The solution and the electric current deposit, e.g., copper, within the openings in order to fill and/or overfill the openings of the photoresist and the first passivation layer 110, thereby forming the conductive pillars 601. Excess conductive material outside of the openings may then be removed using, for example, a chemical mechanical polish (CMP).

After the conductive pillars 601 have been formed, the photoresist may be removed through a process such as ashing, whereby the temperature of the photoresist is increased until the photoresist decomposes and may be removed. After the removal of the photoresist, the conductive pillars 601 extend away from the first passivation layer 110 a first distance $d_1$ of between about 10 mm to about 300 mm, such as about 180 mm.

However, as one of ordinary skill in the art will recognize, the above described process to form the conductive pillars 601 is merely one such description, and is not meant to limit the embodiments to this exact process. Rather, the described process is intended to be merely illustrative, as any suitable process for forming the conductive pillars 601 may alternatively be utilized. For example, forming the first passivation layer 110 to a thickness greater than its eventual thickness, forming the conductive pillars 601 into an opening of the first passivation layer 110, and then removing a top portion of the first passivation layer 110 such that the conductive pillars 601 extend away from the first passivation layer 110 may also be utilized. All suitable processes are fully intended to be included within the scope of the present embodiments.

Figure 7:
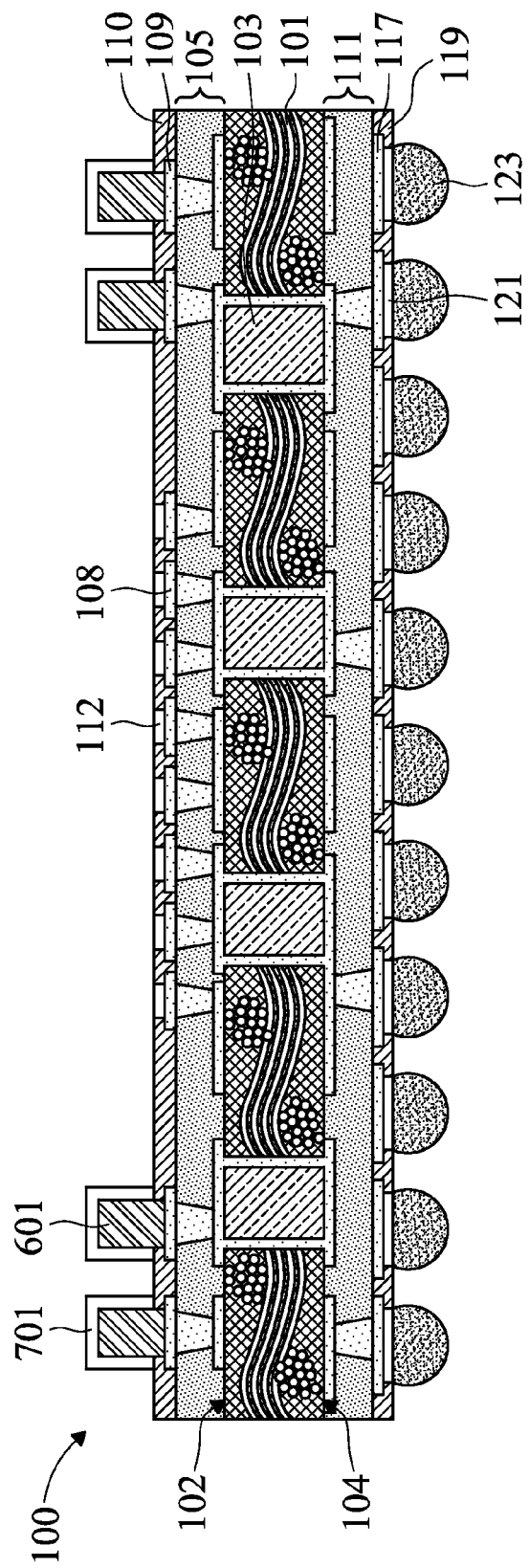
FIG. 7 illustrates a forming a barrier layer onto the conductive pillars in accordance with an embodiment.

FIG. 7 illustrates an optional barrier layer 701 that may be formed over the conductive pillars 601. The barrier layer 701 may be tin or other conductive material and may be formed by a process such as immersion Sn (IT), organic solderability preservative (OSP), self-assembled monolayer (SAM), electroless nickel electroless palladium immersion gold (ENEPIG), combinations of these, or the like. The barrier layer 701 may be formed to a thickness of between about 0.1 μm and about 10 μm, such as about 0.5 μm.

Figure 8:
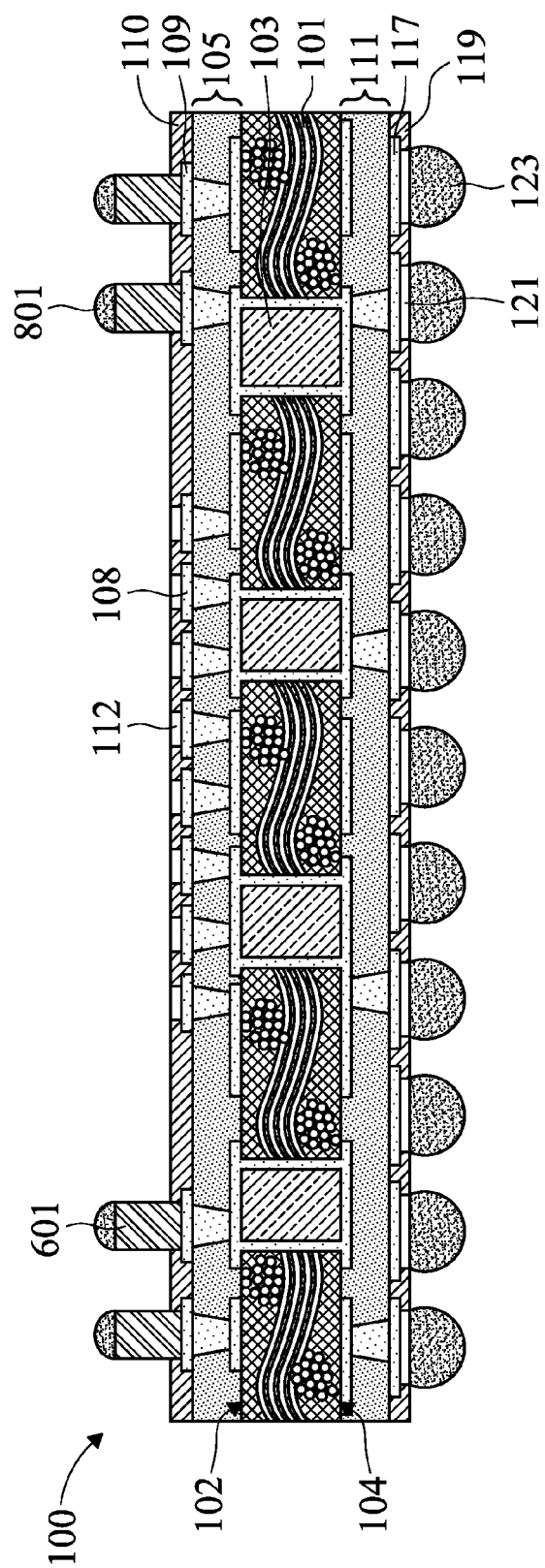
FIG. 8 illustrates a forming of bumps on the conductive pillars in accordance with an embodiment.

FIG. 8 illustrates another embodiment in which the conductive pillars 601 are optionally capped with a conductive material 801. In an embodiment the conductive material 801 may be, e.g., a non-flow solder cap, such as SnZn, SnBi, SnIn, SnCd, or the like. The non-flow solder cap may be formed by electroplating, electroless plating, immersion plating, or the like, to a thickness of between about 1 μm and about 100 μm, such as about 20 μm.

Alternatively, the conductive material 801 may be a flowable material such as a solder. In this embodiment the conductive material 801 may be similar to the material of the first conductive connector 123, such as a tin solder bump formed by plating and a reflow process. However, the conductive material 801 may alternatively be any other suitable conductive material.

Figure 9:
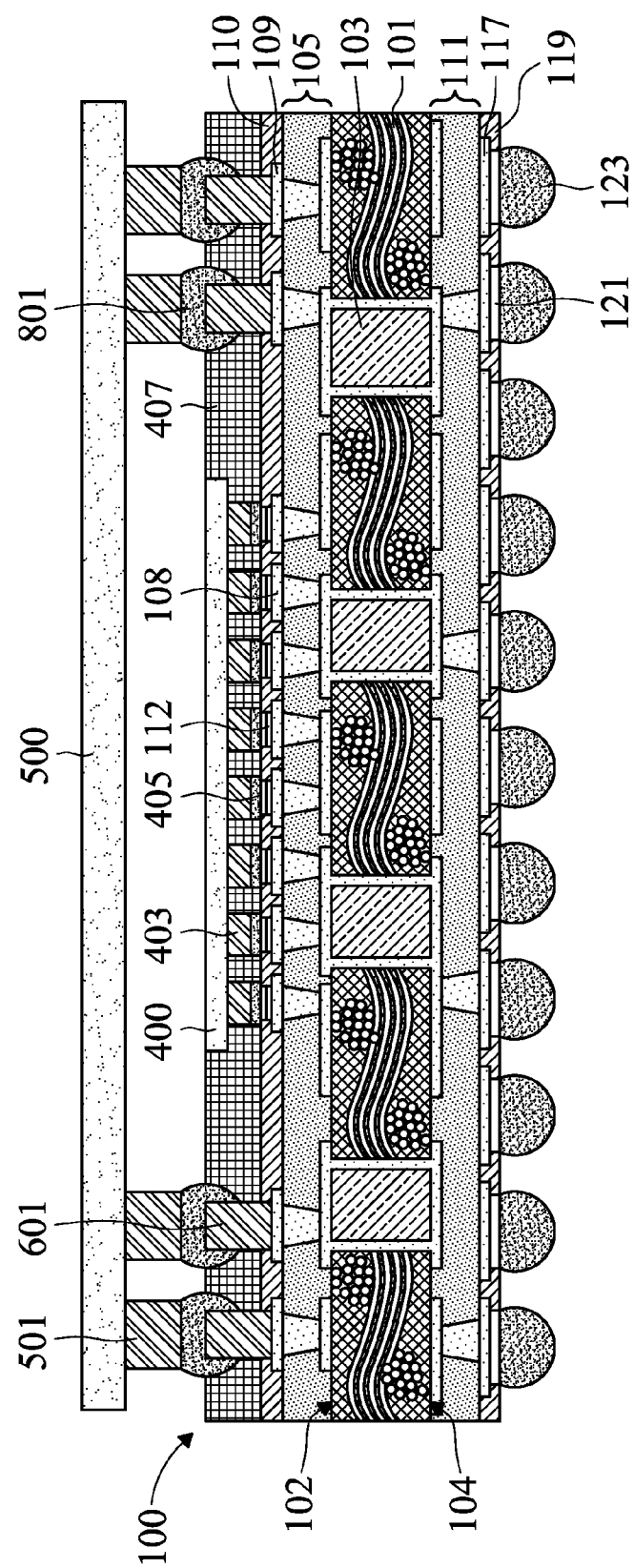
FIG. 9 illustrates a bonding of the second package and the third package to the first package in accordance with an embodiment.

FIG. 9 illustrates the placement and bonding of the second package 400 and the third package 500 onto the first package 100. In an embodiment the second package 400 and the third package 500 may be bonded to the first package 100 using methods and processes similar to those described above with respect to FIG. 4 and FIG. 5, such as by aligning and reflowing a conductive material under pressure to bond the second package 400 and the third package 500. However, any other suitable method of bonding the second package 400 and the third package 500 to the first package 100 may alternatively be utilized.

In accordance with an embodiment, a semiconductor device comprising a first package with a first side and a first contact located on the first side and a second contact located on the first side is provided. A first post-contact material is over the first contact but not over the second contact.

In accordance with another embodiment, a semiconductor device comprising a first contact and a second contact on a first side of a first package is provided. A conductive pillar extends away from the first contact, wherein the second contact is free from a conductive pillar.

In accordance with yet another embodiment, a method for forming a semiconductor device comprising forming a first contact and a second contact on a first package is provided. A height of the first contact is adjusted relative to the second contact by forming a post-contact material over the first contact.

Although the present invention and its advantages have been described in detail, it should be understood that various changes, substitutions and alterations can be made herein without departing from the spirit and scope of the invention as defined by the appended claims. For example, the precise methods and materials used to form the various structures may be altered while still remaining within the scope of the embodiments. Additionally, the precise placement of the contact pads on the first package may be changed to suit the design needs of the first package while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a first package with a first side;
   a first contact located on the first side and a second contact located on the first side;
   a first underbump metallization in physical contact with the first contact;
   a second underbump metallization in physical contact with the second contact;
   a first post-contact material over the first contact and in physical contact with the first underbump metallization but not over the second contact, wherein the first contact, the first underbump metallization and the first post-contact material each have a different composition from each other;

a first external conductive connector in physical contact with the first post-contact material, wherein the first external conductive connector comprises a single material throughout the first external conductive connector, the single material having a different composition than the first post-contact material; and a second package bonded to the second contact, wherein the first external conductive connector extends away from the first package a first distance, the second package extends away from the first package a second distance, the second distance being parallel to and less than the first distance, and wherein the second package comprises a second conductive connector in physical contact with the second underbump metallization.

2. The semiconductor device of claim 1, wherein the first external conductive connector is a solder bump.

3. The semiconductor device of claim 1, wherein the post-contact material is a high-melting point pre-solder material.

4. The semiconductor device of claim 3, wherein the post-contact material comprises SnCu, SnAg, SnAgCu, or SnAu.

5. The semiconductor device of claim 1, wherein the post-contact material has a thickness of between about 10 µm and about 200 µm.

6. A semiconductor device comprising:
a first contact and a second contact on a first side of a first package;
a first underbump metallization in physical contact with the first contact:
a second underbump metallization in physical contact with the second contact;
a conductive pillar in physical connection with the first underbump metallization and extending a first distance away from the first package in a first direction, the first direction being perpendicular to a first surface of the first underbump metallization, the first surface facing the conductive pillar, wherein the second contact is free from a conductive pillar; and
a second package directly bonded to the second underbump metallization, wherein a point on the second package located furthest from the first package is located a second distance no greater than the first distance, wherein the second distance is measured in a second direction that is parallel with the first direction.

7. The semiconductor device of claim 6, further comprising a cap on the conductive pillar.

8. The semiconductor device of claim 7, wherein the cap is solder.

9. The semiconductor device of claim 7, wherein the cap is no-flow solder.

10. The semiconductor device of claim 7, wherein the conductive pillar has an oval shape.

11. The semiconductor device of claim 6, further comprising a second package bonded to the second contact, wherein the second package is not bonded to the conductive pillar.

12. The semiconductor device of claim 6, further comprising vias through the first package to a second side of the first package.

13. The semiconductor device of claim 6, further comprising a plating material located over the conductive pillar.

14. A semiconductor device comprising:
a first package;
a first contact and a second contact within the first package, wherein the first contact and the second contact are located on a first side of a package, wherein the first contact has a first top surface and the second contact has a second top surface planar with the first top surface;
a first underbump metallization in physical contact with the first contact;
a second underbump metallization in physical contact with the second contact;
a first post-contact material in physical contact with the first underbump metallization, wherein the first contact, the first underbump metallization, and the first post-contact material each comprise a different composition of materials;
a second package directly bonded to the second underbump metallization, wherein the first post-contact material is not located between the second package and the second underbump metallization, wherein the second package comprises a semiconductor die within the second package; and
a first conductive connector in physical contact with the first post-contact material, wherein the first conductive connector has a first surface facing away from the first package, the second package has a second surface facing away from the first package, wherein the first surface is located a first distance away from the first package, the first distance being measured in a first direction, wherein the second surface is located a second distance away from the first package, the second distance being measured in the first direction, and wherein the first distance is greater than the second distance.

15. The semiconductor device of claim 14, further comprising a second conductive connector in physical contact with the second contact.

16. The semiconductor device of claim 14, wherein the first post-contact material has a thickness of between about 10 µm and about 200 µm.

17. The semiconductor device of claim 14, wherein the first post-contact material is a high-melting point pre-solder material.

18. The semiconductor device of claim 14, wherein the first post-contact material comprises SnCu, SnAg, SnAgCu, or SnAu.

19. The semiconductor device of claim 14, wherein the first package comprises vias extending from one side of the first package to an opposite side of the first package.

20. The semiconductor device of claim 1, further comprising vias extending from a first side of the first package to a second side of the first package.

* * * * *